(12) United States Patent
Tsai et al.

(10) Patent No.: US 8,373,836 B2
(45) Date of Patent: Feb. 12, 2013

(54) GATE DRIVER-ON-ARRAY AND METHOD OF MAKING THE SAME

(75) Inventors: Tung-Chang Tsai, Hsin-Chu (TW); Ming-Chang Shih, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 1256 days.

(21) Appl. No.: 12/144,649

(22) Filed: Jun. 24, 2008

(65) Prior Publication Data

US 2009/0231310 A1    Sep. 17, 2009

(30) Foreign Application Priority Data

Mar. 11, 2008    (TW) .............................. 97108503 A

(51) Int. Cl.
 *G02F 1/1345*    (2006.01)
(52) U.S. Cl. .......... 349/151; 349/43; 349/143; 349/149; 349/152
(58) Field of Classification Search .................... 349/43, 349/143, 149, 151–152
See application file for complete search history.

(56) References Cited

U.S. PATENT DOCUMENTS

| | | | |
|---|---|---|---|
| 6,674,093 | B1 | 1/2004 | Tanaka |
| 2004/0224241 | A1 | 11/2004 | Park |
| 2004/0242017 | A1 * | 12/2004 | Park et al. ..................... 438/754 |
| 2007/0171115 | A1 * | 7/2007 | Kim et al. ..................... 341/155 |
| 2008/0030668 | A1 * | 2/2008 | Komaju ........................ 349/151 |

* cited by examiner

*Primary Examiner* — Nathanael R Briggs
(74) *Attorney, Agent, or Firm* — Winston Hsu; Scott Margo

(57) ABSTRACT

A gate driver-on-array structure integrated into a display includes a substrate and a gate driver structure formed thereon. The gate driver structure is disposed in a peripheral region of the substrate. The gate driver structure includes a first layer metal pattern, a second layer metal pattern, and an insulating layer disposed therebetween. The first layer metal pattern includes connection nodes. The insulating layer has through holes exposing the connection nodes. The second layer metal pattern fills into the through holes and in contact with the connection nodes of the first layer metal pattern so as to implement necessary electrical connection of the gate driver structure.

7 Claims, 11 Drawing Sheets

US 8,373,836 B2

GATE DRIVER-ON-ARRAY AND METHOD OF MAKING THE SAME

BACKGROUND OF THE INVENTION

1. Field of the Invention

The present invention relates to a gate driver-on-array (GOA) integrated into a display panel and method of making the same, and more particularly, to a GOA in which the electrical connection between a first patterned metal layer and a second patterned metal layer is not implemented by a transparent conductive layer, and method of making the same.

2. Description of the Prior Art

Display panels have been broadly applied in electronic displaying devices, e.g. thin film transistor liquid crystal displays (TFT-LCDs), organic light emitting displays (OLEDs), low temperature polycrystalline silicon (LTPS) TFT-LCDs, plasma display panel (PDP) displays, etc. Refer to FIG. 1. FIG. 1 plan view schematically illustrating a conventional TFT-LCD panel. As shown in FIG. 1, the TFT-LCD panel 10 includes pixels 12 arranged as a matrix. The pixels 12 are controlled by a plurality of data line D1, D2, . . . , Dn, and gate lines G1, G2, . . . , Gn. The data lines D1, D2, . . . , Dn are electrically connected to a data driver 14 and driven thereby, and the gate lines G1, G2, . . . , Gn are electrically connected to the gate driver 16 and driven thereby. In addition, the TFT-LCD panel 10 is electrically connected to a printed circuit board (PCB) 18, so that the circuits of the PCB 18 can convert image signals into voltage signals, and deliver the voltage signals to the data driver 14 and the gate driver 16 via a bus line 20.

In recent years, the GOA integrately formed in the display panel, has gradually replaced the traditional external gate driving chip adapted to drive pixels since the number of required devices and the cost can be both reduced. Referring to FIG. 2, there is illustrated a circuit diagram of a GOA integrated into a display panel. As shown in FIG. 2, the GOA is aimed to provide pulse waves having constant timing, and these pulse waves will be delivered to a TFT-LCD panel 10 to control the switching of thin film transistors. The GOA mainly includes a plurality of signal lines (e.g. L1, L2, L3 and L4), a plurality of thin film transistors (e.g. T1, T2, T3 and T4), capacitors (e.g. C1), and conducting wirings (e.g. W1). The signal line L1 is used to transfer a voltage signal Vss, the signal line L2 is used to transfer a start pulse signal Vst, the signal line L3 is used to transfer a clock signal Vck, and the signal line L4 is used to transfer a complementary clock signal Vxck. The purpose of the conducting wiring W1 is to deliver signals of the signal line e.g. the signal line L4 to an internal device such as the thin film transistor T2.

FIG. 3 is a cross-sectional view of a conventional GOA, which is taken along lines A-A', B-B', and C-C' of FIG. 2, respectively. As shown in FIG. 3, the conventional GOA integrated into a display panel is mainly stacked by six thin films including a first patterned metal layer 22, a gate insulating (GI) layer 24, a semiconductor layer 26, a heavily doped semiconductor layer 28, a second patterned metal layer 30, a passivation layer 32, and a transparent conductive layer (pixel electrode) 34. In the GOA structure, part of the first patterned metal layer 22 must be electrically connected to the second patterned metal layer 30 so as to implement required electrical functions. For instance, the signal line L4 defined by the second patterned metal layer 30 is electrically connected to the conducting wiring W1 defined by the first patterned metal layer 22, so that the voltage signal Vck can be delivered to the drain electrode of the thin film transistor T2 via the conducting wiring W1. Also, the gate electrode of the thin film transistor T1 made of the first patterned metal layer 22 must be electrically connected to the drain made of the first patterned metal layer 30.

In the conventional GOA structure, as shown in FIG. 3, the first patterned metal layer 22 and the second patterned metal layer 30 are electrically connected together by forming through holes 32A in the passivation layer 32 and the gate insulating layer 24 disposed thereunder, and by successively filling the transparent conductive layer 34 into the through holes 32A. Accordingly, the first patterned metal layer 22 and the second patterned metal layer 30 are electrically connected. Using the transparent conductive layer 34 to bridge the first patterned metal layer 22 and the second patterned metal layer 30, however, suffers from the following drawbacks. First, through hole corrosion tends to occur in the through hole areas during subsequent processes, and parasitic capacitances may generate in the connection structure. Besides, the connection structure made of the transparent conductive layer is disposed under the sealant, which is liable to cause metal precipitate. This would lead to a poor electrical contact between the first patterned metal layer and the second patterned metal layer, thereby generating wave pulses having abnormal waveform. In addition, using the transparent conductive layer to connect the first patterned metal layer and the second patterned metal layer increases the layout area of the GOA.

SUMMARY OF THE INVENTION

It is therefore one of the objectives of the present invention to provide a GOA integrated into a display panel (such as TFT-LCD, OLED, LTPS TFT-LCD, and PDP) and method of making the same to reduce the layout area, improve the electrical reliability, and simplify the process of GOA.

In one embodiment of the present invention, a gate driver-on-array integrated into a liquid crystal display is provided. The GOA includes a substrate having a peripheral region, and a GOA structure disposed in the peripheral region of the substrate. The GOA structure includes a first patterned metal layer, a second patterned metal layer, and an insulating layer disposed therebetween. The first patterned metal layer includes a plurality of connection nodes, the insulating layer has a plurality of through holes exposing the connection nodes, and the second patterned metal layer fills into the through holes and in contact with the connection nodes of the first patterned metal layer.

According to another embodiment, a method for fabricating a GOA integrated into a display panel is provided. The method includes the following steps. A substrate is provided, and a peripheral region is defined on the substrate. Then, a first patterned metal layer is formed in the peripheral region of the substrate, where the first patterned metal layer includes a plurality of connection nodes. Subsequently, an insulating layer is formed on the substrate and the first patterned metal layer, and a plurality of through holes are formed in the insulating layer corresponding to and exposing the connection nodes respectively. Accordingly, a second patterned metal layer is formed, and the second patterned metal layer is filled into the through holes, where the second patterned metal layer is in contact with the connection nodes.

The GOA structure of the present invention uses the second patterned metal layer to overlap and contact the first patterned metal layer without requiring forming through holes in the passivation layer and using the transparent conductive layer to implement electrical connection. Thus, the layout area is reduced, the electrical reliability is improved, and the process of GOA is simplified. In addition, the present invention is not limited to use for liquid crystal displays, and may be broadly applied in various types of display devices.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
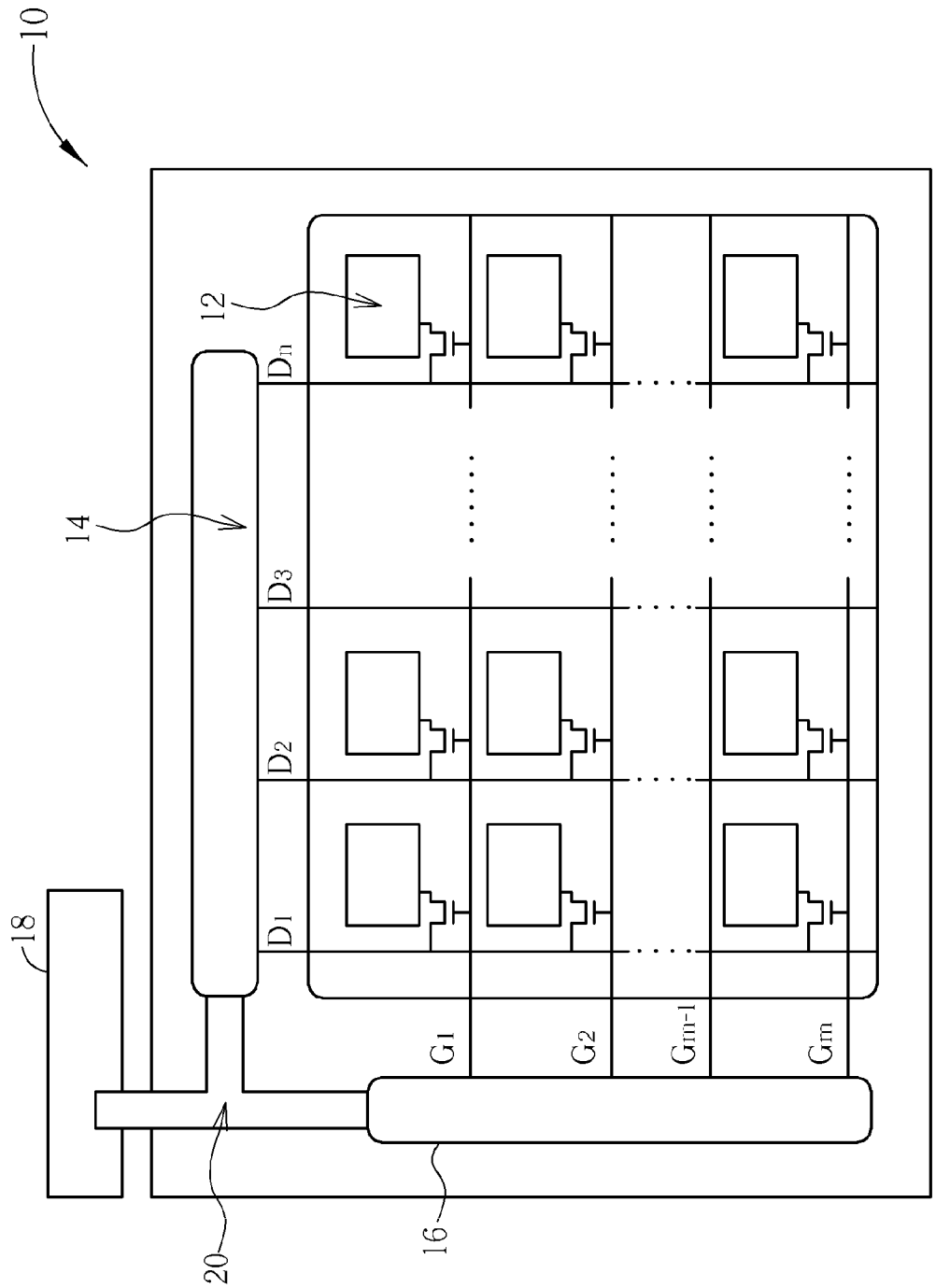
FIG. 1 is a plan view schematically illustrating a conventional TFT-LCD panel.
Figure 2:
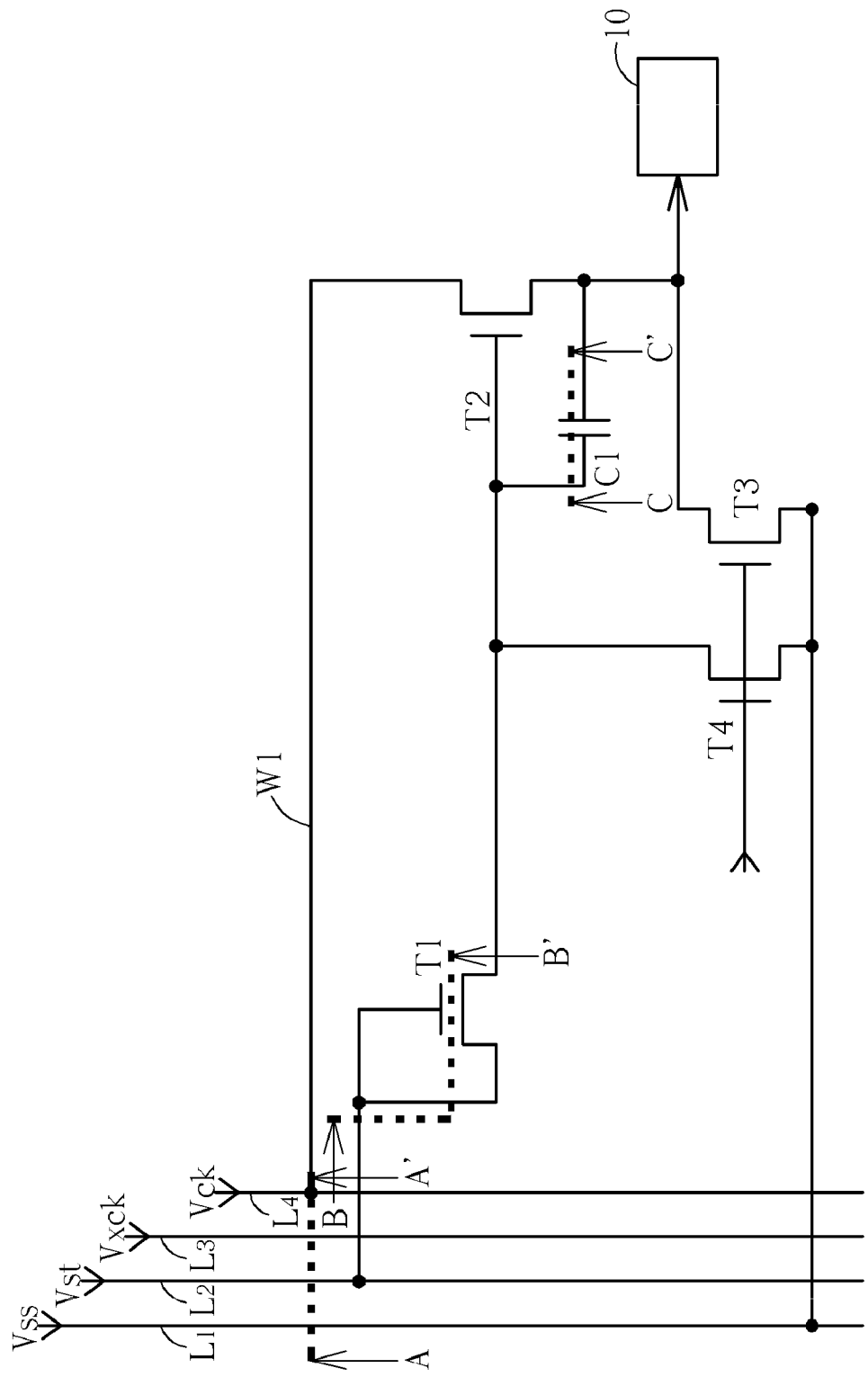
FIG. 2 illustrates a circuit diagram of a GOA integrated into a display panel, according to prior art.
Figure 4:
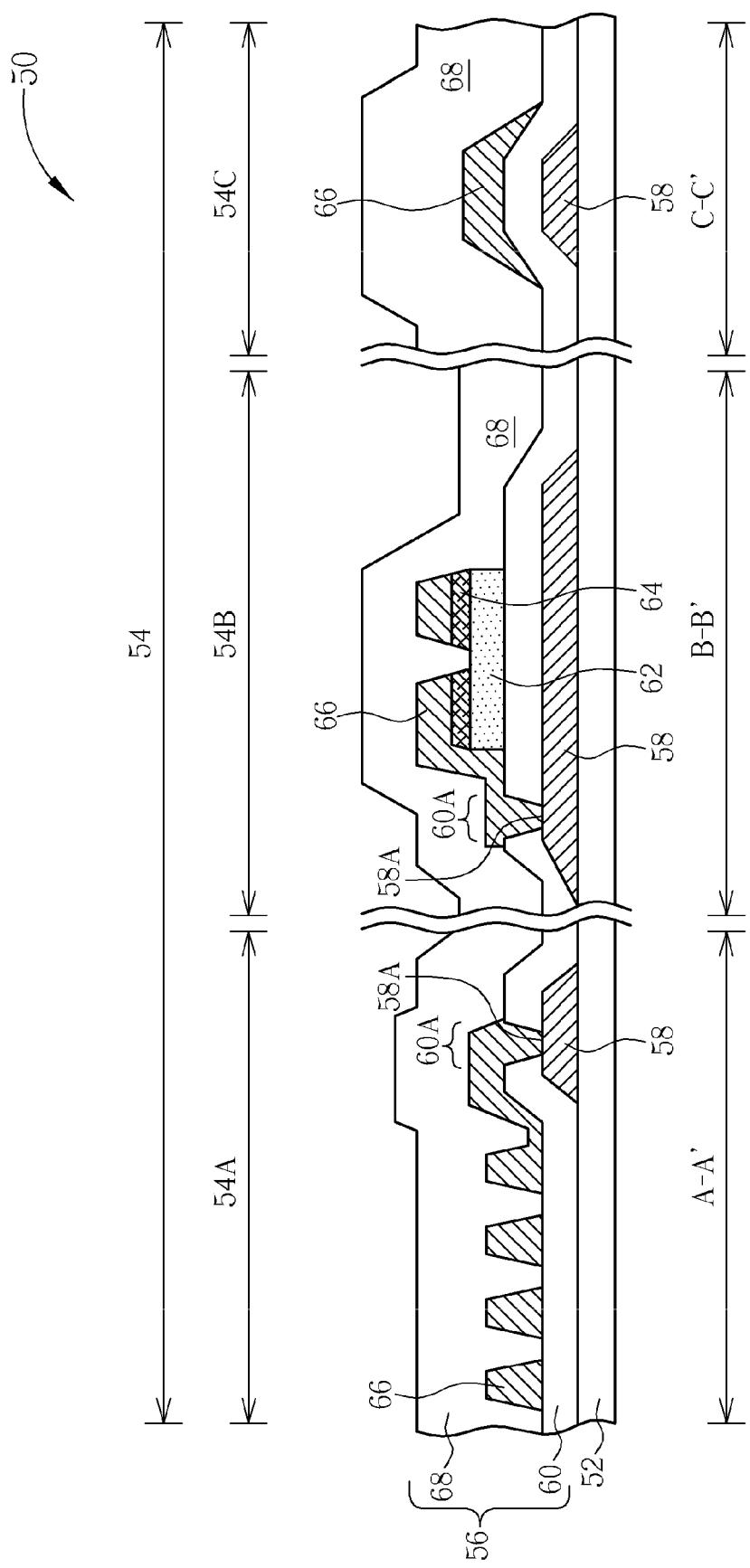
FIG. 4 is a cross-sectional view of a GOA integrated into a display, according to a preferred embodiment of the present invention.

Referring to FIG. 4 in conjunction with the circuit diagram of the GOA shown in FIG. 2. FIG. 4 is a cross-sectional view of a GOA integrated into a display according to a preferred embodiment of the present invention, which is taken along lines A-A', B-B', and C-C' of FIG. 2, respectively. As shown in FIG. 4, the GOA 50 includes a substrate 52, and a GOA structure 56. The substrate 52, which includes a peripheral region 54 and a pixel region (not shown), is the array substrate (also referred to as TFT substrate) of a liquid crystal display panel, and the GOA structure 56 is disposed in the peripheral region 54 of the substrate 52. The peripheral region 54 includes a signal line connection region 54A, a TFT region 54B, and a capacitor region 54C. The GOA structure 56 from bottom to top includes a first patterned metal layer 58, an insulating layer 60, a semiconductor layer 62, a heavily doped semiconductor layer 64, a second patterned metal layer 66, and a passivation layer 68, and the above thin films compose each device of the GOA structure 56. In the signal line connection region 54A, the first patterned metal layer 58 serves as the conducting wiring W1, and the second patterned metal layer 66 serves as the signal lines L1, L2, L3, L4. In the TFT region 54B, the first patterned metal layer 58 serves as the gate electrodes, the insulating layer 60 serves as the gate insulating layer, the semiconductor layer 62 serves as the channel, the heavily doped semiconductor layer 64 serves as the ohmic contact layer, and the second patterned metal layer 66 serves as the source electrodes and drain electrodes of the thin film transistors T1, T2, T3, T4. In the capacitor region 54C, the first patterned metal layer 58 serves as the bottom electrode, the insulating layer 60 serves as the capacitor dielectric, and the second patterned metal layer 66 serves as the upper electrode.

The first patterned metal layer 58 includes a plurality of connection nodes 58A, which are aimed to provide electrical connection with the second patterned metal layer 66. The insulating layer 60 is disposed between the first patterned metal layer 58 and the second patterned metal layer 66, and the insulating layer 60 has a plurality of through holes 60A, which expose the connection nodes 58A of the first patterned metal layer 58. The second patterned metal layer 66 is disposed over the insulating layer 60, and filled into the through holes 60A of the insulating layer 60. Accordingly, the second patterned metal layer 66 is in contact with the connection nodes 58A of the first patterned metal layer 58, thereby implementing required electrical connection of the GOA structure 56. The passivation layer 68 covers the second patterned metal layer 66 and the insulating layer 60, so that the second patterned metal layer 66 is not exposed.

The connection nodes 58A may be any points of the first patterned metal layer 58 required to be electrically connected with the second patterned metal layer 66. For instance, the connection node 58A of the first patterned metal layer 58 may be a terminal of a conducting wiring (e.g. the conducting wiring W1 of FIG. 2), and the second patterned metal layer 66 overlapping the connection node 58A may be a signal line (e.g. the signal line L4). In another word, the signal line L4 is in directly contact with the conducting wiring W1 so as to implement the electrical connection, instead of by another conductive structure. In addition, the connection node 58A may also be the gate electrode of a thin film transistor (e.g. the thin film transistor T1 of FIG. 2), and the second patterned metal layer 66 overlapping the connection node 58A may be the source electrode or the drain electrode of the thin film transistor T1. Accordingly, the source electrode or the drain electrode are in direct contact with the gate electrode of the thin film transistor T1 without requiring any extra conductive structure. The application of the present invention is not limited by the above locations and types of display device. The electrical connection between any points of the first patterned metal layer 58 and the second patterned metal layer 66 may be completed by directly contacting the second patterned metal layer 66 and the connection nodes 58A of the first patterned metal layer 58.

Figure 3:
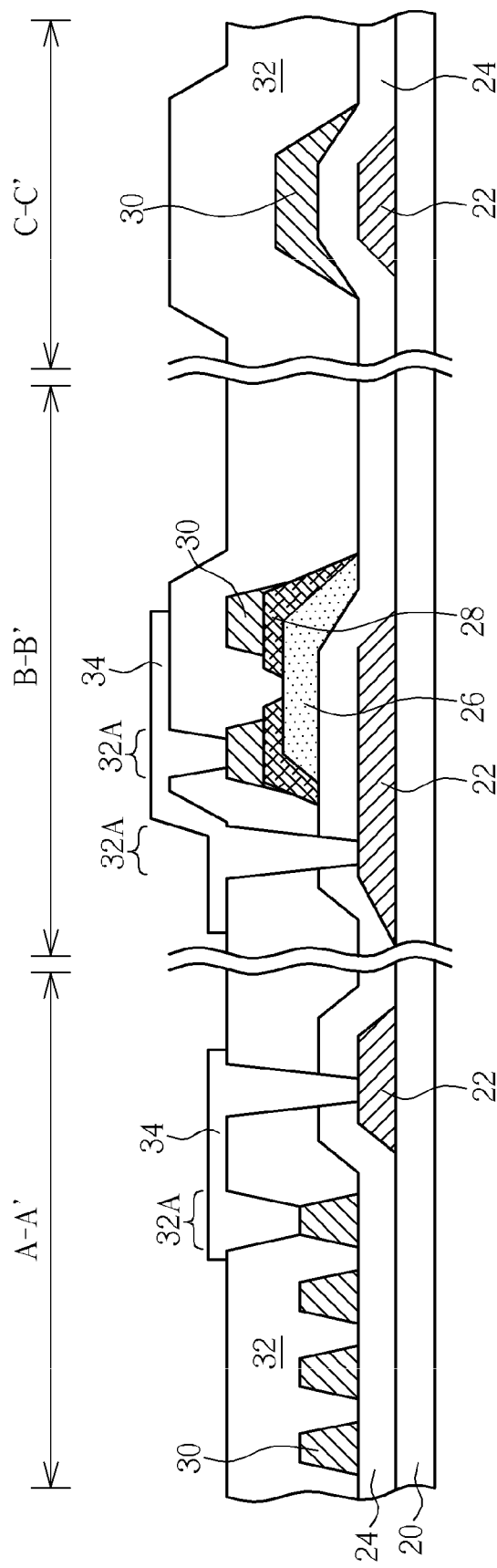
FIG. 3 is a cross-sectional view of a conventional GOA.

Different from the conventional GOA structure (as shown in FIG. 3) that uses the transparent conductive layer 34 to electrically connect the first patterned metal layer 22 and the second patterned metal layer 30, the GOA structure (as shown in FIG. 4) of the present invention makes the second patterned metal layer 66 contact with the first patterned metal layer 58, and therefore no through hole is formed in the passivation layer 68. The passivation layer 68 can therefore entirely wrap the second patterned metal layer 66, and avoid the through hole corrosion. In addition, the layout area of GOA can be reduced accordingly.

Figure 5:
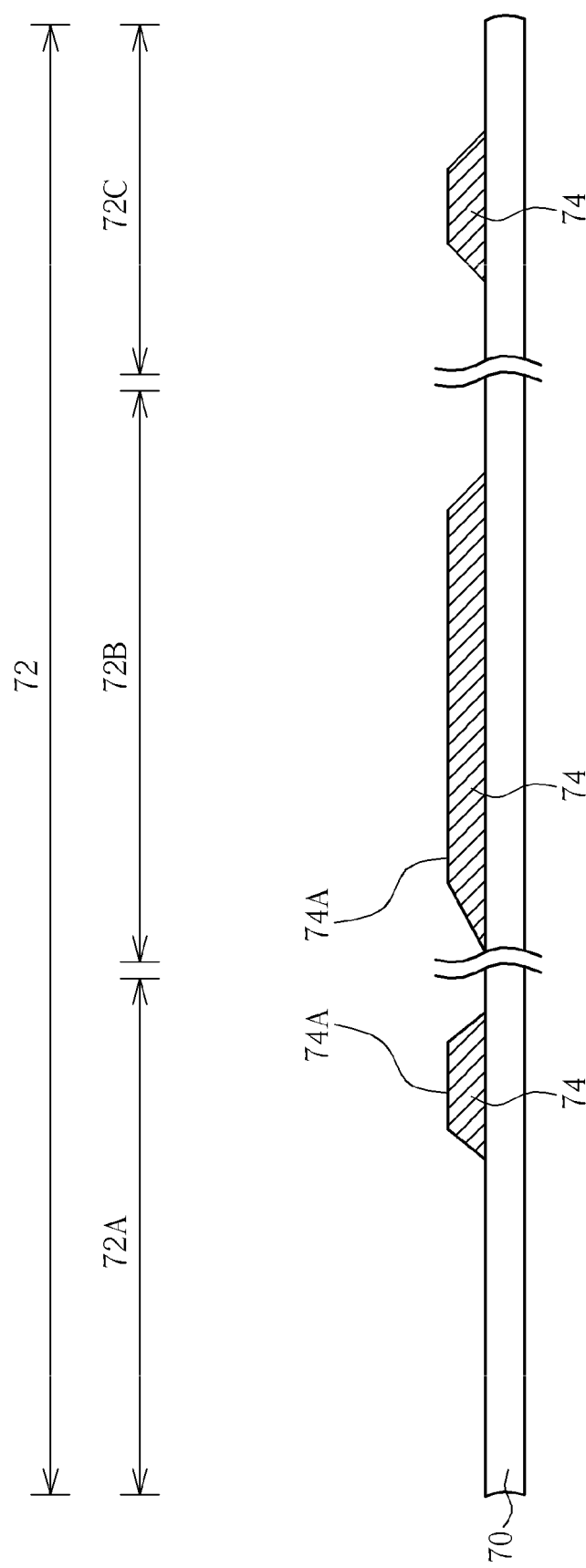
FIGS. 5-9 schematically illustrate a method of forming a GOA structure integrated into a display panel according to a preferred embodiment of the present invention.

Referring to FIGS. 5-9 in conjunction with FIG. 2, FIGS. 5-9 schematically illustrate a method of forming a GOA structure integrated into a display panel according to a preferred embodiment of the present invention. This embodiment uses a liquid crystal display panel as an example; however, the method of the present invention is not limited to be applied to a liquid crystal display panel, and can be applied to various types of display panels. As shown in FIG. 5, a substrate 70 is provided. The substrate 70, which is an array substrate of a liquid crystal display panel, has a peripheral region 72 defined thereon for accommodating peripheral circuits. The peripheral region 72 includes a signal line connection region 72A, a TFT region 72B, and a capacitor region 72C. In the drawings of this embodiment, only the signal line connection region 72A, the TFT region 72b, and the capacitor region 72C are drawn for highlighting the features of the present invention, but the application of the method of the present invention is limited. Subsequently, a metal layer (not shown) is formed in the peripheral region 72 of the substrate 70, and photolithographic and etching techniques are used to remove part of the metal layer to form a first patterned metal layer 74. The first patterned metal layer 74 defines conducting wirings in the signal line connection region 72A, gate electrodes of the thin film transistors in the TFT region 72B, and bottom electrodes of the capacitors in the capacitor region 72C. In addition, the first patterned metal layer 74 includes a plurality of connection nodes 74A for electrically connecting to a second patterned metal layer (not shown) to be formed. As described, the locations of the connection nodes 74A are exemplarily drawn, and therefore any appropriate points in the first patterned metal layer 74 may be selected as the connection nodes 74A based on practical requirement by those skilled in the art.

Figure 6:
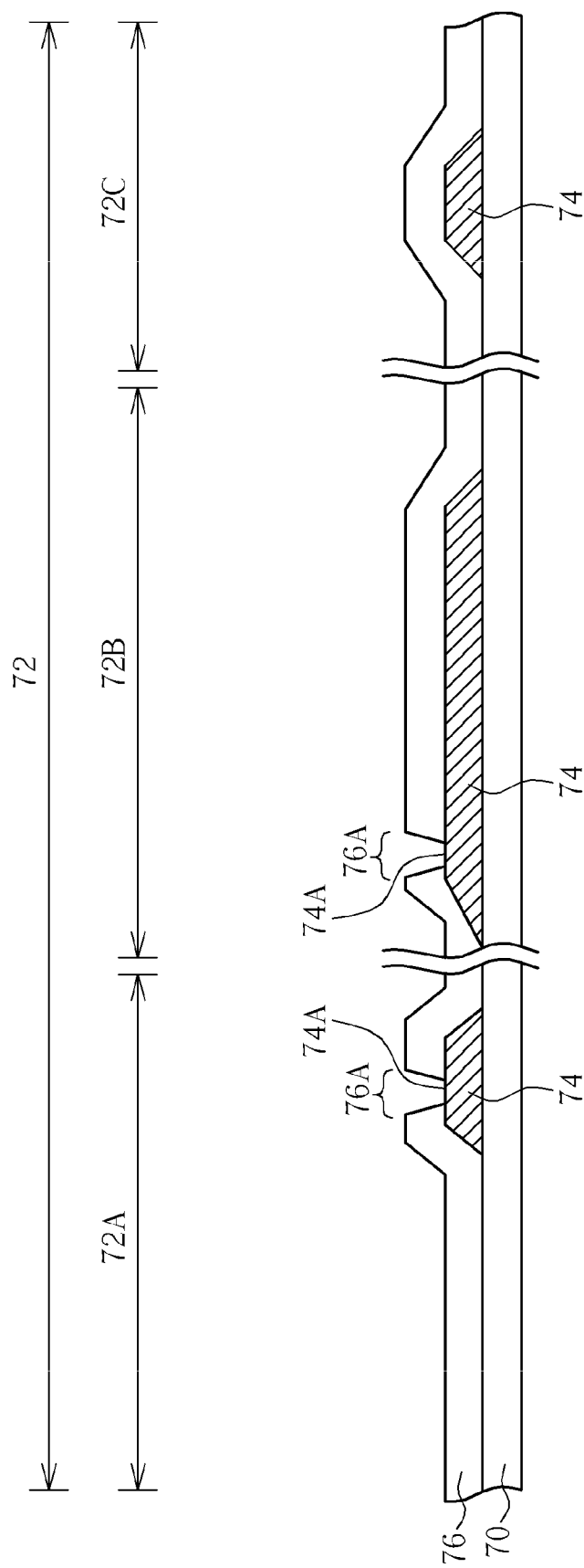
Figure 7:
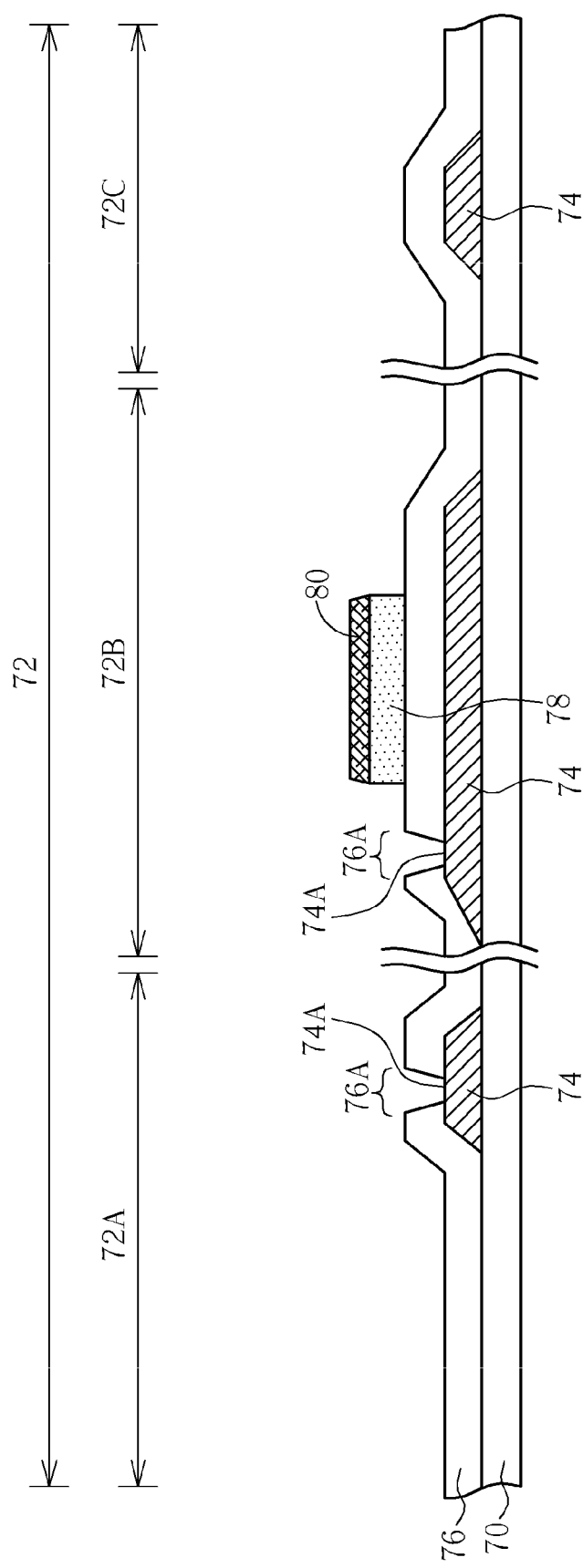

As shown in FIG. 6, an insulating layer 76 is formed on the substrate 70 and the first patterned metal layer 74, and the insulating layer 76 is partially removed by photolithographic and etching techniques to form a plurality of through holes 76A corresponding to and exposing the connection nodes 74A. The insulating layer 76 provides insulation function to avoid shot-circuit in the signal line connection region 72A. Also, the insulating layer 76 serves as the gate insulating layer in the TFT region 72B, and serves as the capacitor dielectric in the capacitor region 72C. As shown in FIG. 7, a semiconductor layer 78 and a heavily doped semiconductor layer 80 are consecutively formed on the insulating layer 76 in the TFT region 72B. The semiconductor layer 78 is used as the channel, and the heavily doped semiconductor layer 80 is used as the ohmic contact layer.

Figure 8:
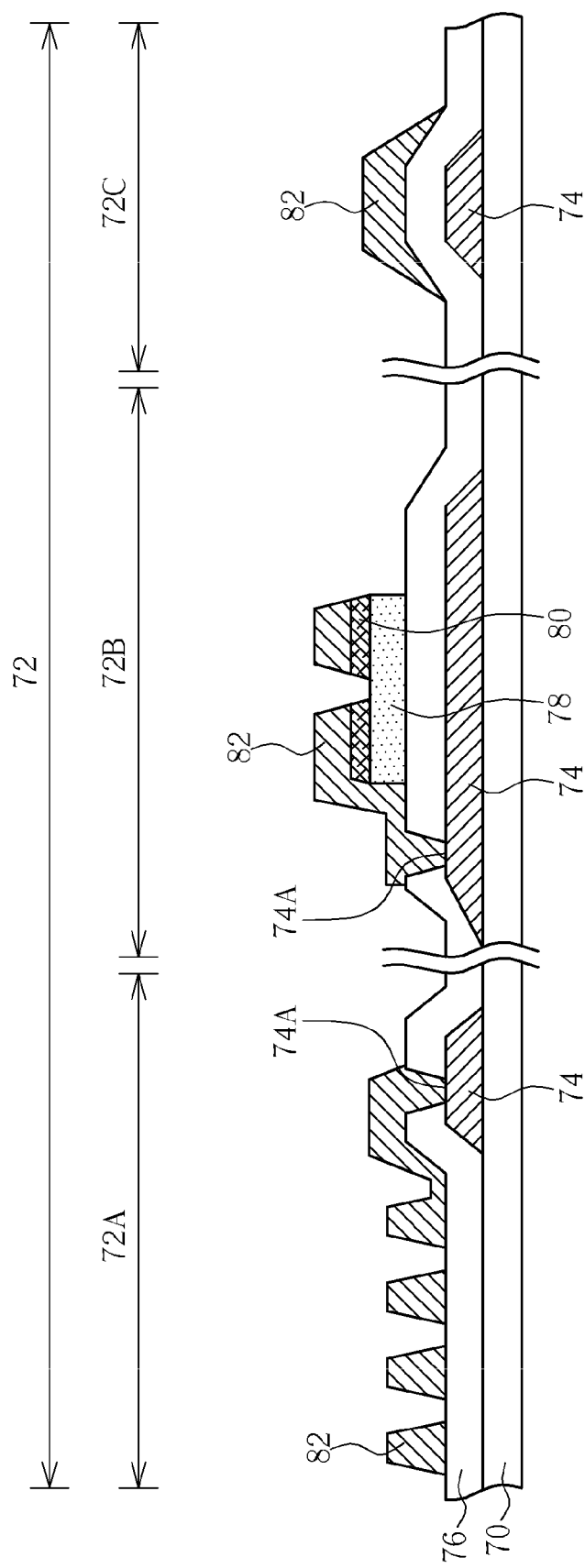

As shown in FIG. 8, another metal layer (not shown) is formed on the insulating layer 76 and the heavily doped semiconductor layer 80, and the metal layer is partially removed by photolithographic and etching techniques to form a second patterned metal layer 82. Subsequently, the second patterned metal layer 82 is used as an etching hard mask to define the pattern of the heavily doped semiconductor layer 80 serving as the ohmic contact layer. The second patterned metal layer 82 defines signal lines in the signal line connection region 72A, source electrodes and drain electrodes in the TFT region 72B, and top electrodes of the capacitors in the capacitor region 72C. Also, the second patterned metal layer 82 is filled into the through holes 76A of the insulating layer 76 to overlap and contact with the connection nodes 74A of the first patterned metal layer 74 at locations of the first patterned metal layer 74 (e.g. the signal lines, or the gate electrodes of the thin film transistors) necessary to electrically connect to the second patterned metal layer 82. It is appreciated that the second patterned metal layer 82 is in direct contact with the first patterned metal layer 74 via the through holes 76A of the insulating layer 76. Therefore, no extra conductive layer is required, and the layout area of the GOA is accordingly minimized.

Figure 9:
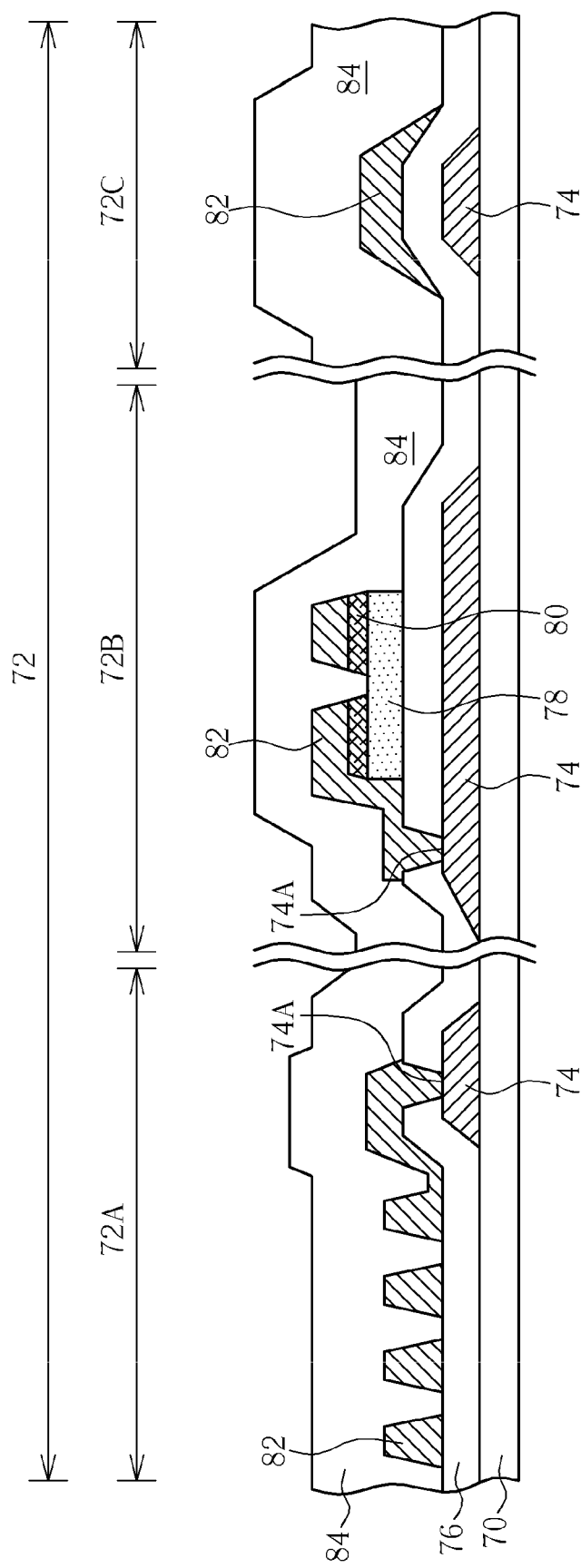

As shown in FIG. 9, a passivation layer 84 is formed on the second patterned metal layer 82. The passivation layer 84 covers the second patterned metal layer 82, and ensures the second patterned metal layer 82 from being exposed.

Figure 10:
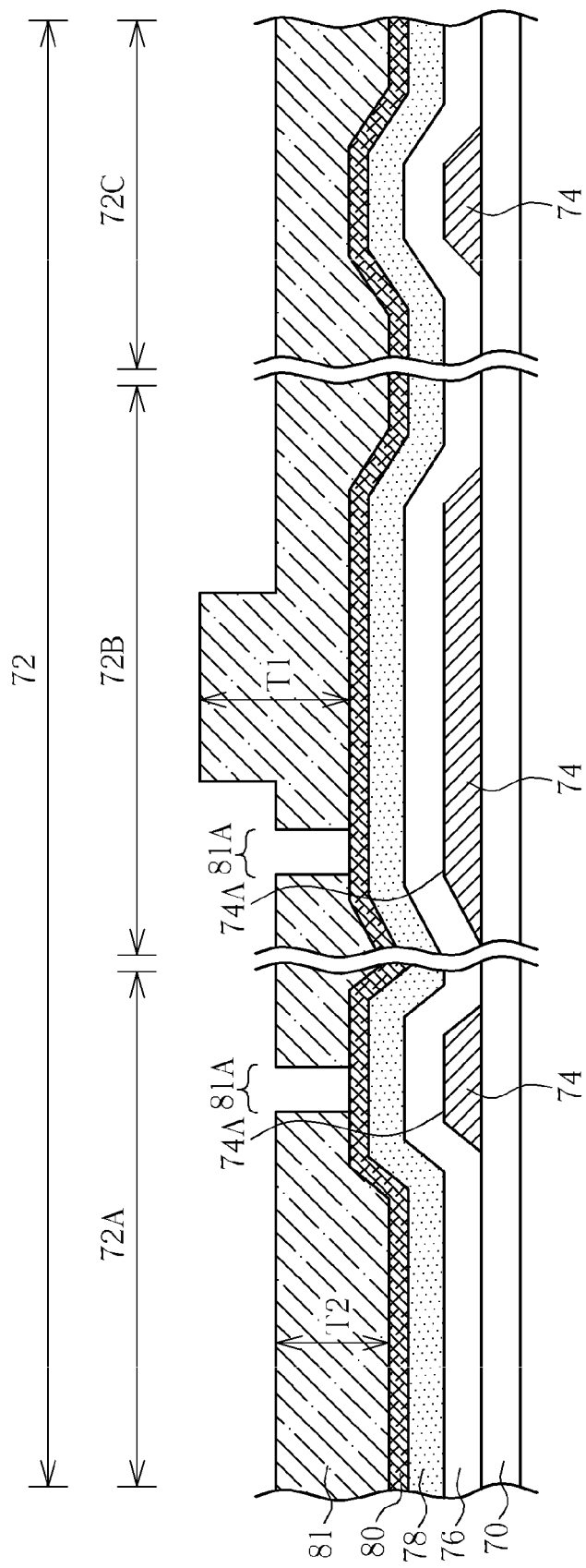
FIGS. 10-11 schematically illustrate a method of forming a GOA structure integrated into a display panel according to another preferred embodiment of the present invention.
Figure 11:
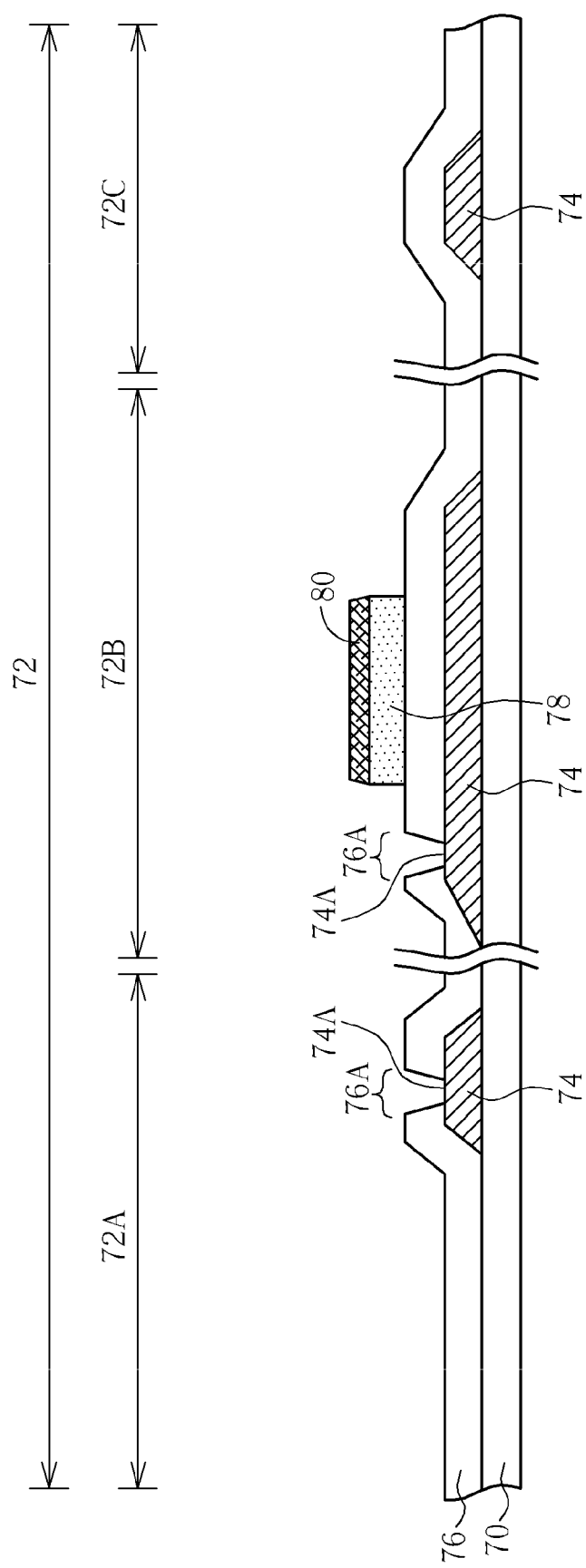

In the aforementioned embodiment, the insulating layer and the semiconductor layer are defined by two different photo masks, however, the method of the present invention is not limited by the above embodiment. Referring to FIGS. 10-11 in conjunction with FIG. 5 and FIGS. 8-9. FIGS. 10 and 11 schematically illustrate a method of forming a GOA structure integrated into a display panel according to another preferred embodiment of the present invention. The steps of forming the insulating layer, the semiconductor layer, and the heavily doped semiconductor layer in this embodiment are different from the previous embodiment, and the identical elements are denoted by the identical numerals in these two embodiments. As shown in FIG. 10, after the first patterned metal layer 74 is formed, an insulating layer 76, a semiconductor layer 78, and a heavily doped semiconductor layer 80 are consecutively formed on the substrate 70 and the first patterned metal layer 74. Then, a photoresist layer 81 having different thicknesses in different regions is formed on the heavily doped semiconductor layer 80. The photoresist layer 81 may be formed by half-tone photo mask, but not limited. The half-tone photo mask includes an opaque area, a transparent area, and a semi-transparent area, where the opaque area of the photo mask is corresponding to a region of the photoresist layer 81 having a first thickness T1, the transparent area of the photo mask is corresponding to an opening 81A of the photoresist layer 81, and the semi-transparent area of the photo mask is corresponding to a region of the photoresist layer 81 having a second thickness T2. Accordingly, the photoresist layer 81 will have a first thickness T1, a second thickness T2 thinner than the first thickness T1, and an opening 81A. As shown in FIG. 11, an etching process is performed with the photoresist layer 81A having different thicknesses so as to form through holes 76A corresponding to the connection nodes 74A in the insulating layer 76, while part of the semiconductor layer 78 over the insulating layer 76 is maintained as the channel, and part of the heavily doped semiconductor layer 80 is maintained as the ohmic contact layer in the TFT region 72B. The method of this embodiment uses only one photo mask to define the through holes 76A of the insulating layer 76 and the pattern of the semiconductor layer 78, and thus one photolithographic process is omitted. The successive process steps are similar to the above embodiment as shown in FIGS. 8 and 9, and thus are not redundantly described.

The GOA structure of the present invention uses the second patterned metal layer to overlap and contact the first patterned metal layer without requiring forming through holes in the passivation layer and using the transparent conductive layer or an extra conductive layer, and thus the process step is reduced. In addition, the second patterned metal layer is covered by the passivation layer, which protects the second patterned metal layer from being damaged, and therefore the reliability is improved. Furthermore, the layout area of the GOA of the present invention is minimized, which makes the display panel have slim border.

Those skilled in the art will readily observe that numerous modifications and alterations of the device and method may be made while retaining the teachings of the invention.

What is claimed is:

1. A gate driver-on-array integrated into a display panel, comprising:
a substrate including a peripheral region; and
a gate driver-on-array structure disposed in the peripheral region of the substrate, the gate driver-on-array structure comprising a first patterned metal layer, a second patterned metal layer, an insulating layer disposed therebetween, and a thin film transistor, wherein the first patterned metal layer includes a plurality of connection nodes, the insulating layer has a plurality of through holes exposing the connection nodes, and the second patterned metal layer fills into the through holes and contacts the connection nodes of the first patterned metal layer, and wherein the thin film transistor comprises a gate electrode, a source electrode, and a drain electrode disposed in the peripheral region of the substrate, each of the connection nodes of the first patterned metal layer comprises the gate electrode, and the second patterned metal layer in contact with each of the connection nodes comprises the source electrode or the drain electrode.

2. A method for fabricating a gate driver-on-array integrated into a display panel, the method comprising:

providing a substrate having a peripheral region defined thereon;

forming a first patterned metal layer in the peripheral region of the substrate, wherein the first patterned metal layer comprises a plurality of connection nodes and a gate electrode;

forming an insulating layer on the substrate and the first patterned metal layer, and forming a plurality of through holes in the insulating layer corresponding to and exposing the connection nodes respectively; and forming a second patterned metal layer, and filling the second patterned metal layer into the through holes, wherein the second patterned metal layer is in contact with the connection nodes, the second patterned metal layer in contact with each of the connection nodes comprises a source electrode or a drain electrode, and the gate electrode, the source electrode and the drain electrode form a thin film transistor in the peripheral region of the substrate.

3. The gate driver-on-array of claim 1, further comprising a passivation layer covering the second patterned metal layer.

4. The gate driver-on-array of claim 1, wherein the thin film transistor further includes a semiconductor layer and a heavily doped semiconductor layer disposed between the insulating layer and the source electrode and the drain electrode.

5. The method of claim 2, further comprising forming a passivation layer on the second patterned metal layer.

6. The method of claim 2, further comprising forming a semiconductor layer and a heavily doped semiconductor layer between the insulating layer and the source electrode and the drain electrode.

7. The method of claim 6, wherein a pattern of the insulating layer and a pattern of the semiconductor layer are defined by a photoresist layer having different thicknesses.

* * * * *